United States Patent
Webe

[11] Patent Number: 5,099,183
[45] Date of Patent: Mar. 24, 1992

[54] PROPORTIONAL-INTEGRAL PROCESS CONTROLLER HAVING A COMPARATOR WITH A VARIABLE SLOPE RAMP GENERATOR AND A CONSTANT THRESHOLD GENERATOR

[75] Inventor: Sami J. C. Webe, Zionsville, Ind.

[73] Assignee: American Power Equipment Company, Harrison, Ohio

[21] Appl. No.: 582,622

[22] Filed: Sep. 14, 1990

[51] Int. Cl.⁵ .............................................. H02P 5/00
[52] U.S. Cl. .................................. 318/268; 318/609; 290/40 R
[58] Field of Search ................. 318/268, 270, 271, 66, 318/778, 779, 782, 799, 802, 805, 807, 808, 812, 609, 610; 290/40 R, 40 A, 40 B, 40 F, 51; 364/160-162

[56] References Cited

U.S. PATENT DOCUMENTS

| | | | |
|---|---|---|---|
| 3,892,975 | 7/1975 | Yannone et al. | 290/40 |
| 3,939,328 | 2/1976 | Davis | 290/40 R |
| 4,152,758 | 5/1979 | Bailey et al. | 318/778 X |
| 4,242,592 | 12/1980 | Yannone et al. | 290/40 R |
| 4,308,463 | 12/1981 | Giras et al. | 290/40 R |

*Primary Examiner*—William M. Shoop, Jr.
*Assistant Examiner*—A. Jonathan Wysocki
*Attorney, Agent, or Firm*—Frost & Jacobs

[57] ABSTRACT

A process controller for maintaining constant pressure under varying flow conditions, including a variable ramp generator and a constant threshold generator which are used to phase-control the current to the pump motor. The process controller can operate over a wide range of incoming AC power line frequencies, and has safety features which drive the motor to its mininum speed in the event of a failure at the setpoint control potentiometer and also disconnect power to the controller if the pressure exceeds a dangerous magnitude.

14 Claims, 10 Drawing Sheets

PROPORTIONAL-INTEGRAL PROCESS CONTROLLER HAVING A COMPARATOR WITH A VARIABLE SLOPE RAMP GENERATOR AND A CONSTANT THRESHOLD GENERATOR

TECHNICAL FIELD

The present invention relates generally to variable-output controller equipment, and is particularly directed to proportional-integral process controllers. The invention will be specifically disclosed with a pressure transducer as the input signal device, and with a permanent magnet (direct current) motor as the output device means to control the process variable (pressure) at a user-determined setpoint.

BACKGROUND OF THE INVENTION

Proportional output controllers are used in a multitude of applications, including simple "gain" controllers ("Proportional"), and more complex "gain" with "reset" controllers ("Proportional-Integral" or "P-I"), and also yet more complex "gain" with "reset" and "rate" controllers ("Proportional-Integral-Differential" or "P-I-D"). Proportional output controllers have a variable (analog) output, rather than a one-step ON-OFF (digital) output.

Proportional-integral controllers are commonly used to control the speed of motors, the positioning of proportional valves, the feed rate of fuel consuming devices, and many other applications. One use of variable-speed motor control is to control the pressure of a system so as to keep it at a constant setpoint. In such a system, the operator of the system would adjust the setpoint (in this case, the pressure setting) to the desired amount, then the proportional-integral controller would keep the system pressure (the "process variable") very near to that setpoint by either speeding up or slowing down, as required, the motor that drives the pressure-creating device (such as a pump). The sought-after goals of such a control system are: reliable and safe operation, efficient energy usage, stable control, and "tight" control—keeping the process variable very close to the setpoint under all operating conditions. Another goal of every control system is low cost of implementation.

A constant-pressure control system is often difficult to implement properly. Factors such as the location of the pressure transducer and the characteristics of the system load are very important. One very difficult system to control is where the pump (and motor) are turning very slowly, if at all, against a "dead head," where the system load is at the desired pressure (at setpoint) and there is no flow, then a valve is suddenly opened—demanding full flow—with an immediate pressure drop due to the slow or zero speed of the pump. In this circumstance, not only does the mechanical equipment need to be chosen wisely so that it can respond quickly, but the control system must also be able to respond quickly. The variable-speed motor control system must be able to control, with stability, the speed of the motor from full speed all the way down to zero speed in order to perform this application.

There are various P-I and P-I-D controllers available in the prior art. Some of them can perform most of the functions described above, however, many such controllers are quite complex (some use digital techniques, such as microprocessors) and are thus relatively expensive. Other controllers in the prior art use analog techniques, but are still relatively complex (and expensive) in order to perform the wide speed range of control needed to perform the above application.

Analog controllers with proportional outputs in the prior art typically use a variable "threshold" against a constant "ramp" to achieve "phase-control" of an AC sine wave, thereby controlling the amount of energy passed through to the controlled device (a motor, or a valve actuator). The constant "ramp" is timed to start at a low value (near zero volts, for example), then ramp up at a given rate during the half-cycle of each AC sine wave. The "threshold" voltage is determined by the position of the setpoint, and is therefore "variable." Typically, the ramp increases until it reaches the threshold at which time the phase-control "fires," thus turning on an electronic switch which then passes current to the controlled device. If, for any reason, the setpoint control (typically a potentiometer) has a wire break on it, it is very possible for the threshold voltage to then drop to zero volts; if that occurs, the ramp voltage would then exceed the threshold voltage at all times, and the electronic switch would always be "ON." In this situation, the motor (and its driven pump) would then continually run at maximum speed, regardless of its present requirements, leading to a possible safety hazard.

Typical phase-control circuits in the prior art are frequency dependent, i.e., they operate only on one given line frequency, or within a very narrow range of line frequencies. Such circuits are dependent on the "ramp" voltage, which operates at a given time constant. The ramp must fit within each half-cycle of the AC sine wave so the ramp is, therefore, dependent on the line frequency. By the same token, since the ramp function is dependent on the line frequency being a relative constant, then so is the entire phase-control firing circuit dependent on a constant line frequency. In other words, a circuit set up for 60 Hz would probably not run properly on a 50 Hz power source, and definitely not on a 400 Hz power source.

SUMMARY OF THE INVENTION

It is a primary object of the present invention to provide a highly reliable and safe proportional-integral controller having stable operating characteristics, yet also having "tight" control characteristics.

It is another object of the present invention to provide a proportional-integral controller that has both stable and tight control characteristics, and can be built for low cost.

It is yet another object of the present invention to provide a proportional-integral controller that has both stable and tight control, and has very quick transient response to sudden changes in the condition of the load, such as where a constant pressure system is running at setpoint pressure and zero (dead-head) flow and then has a valve suddenly open creating a demand for full-flow.

Yet another object of the present invention is to provide a proportional-integral controller that has both stable and tight control, and overcomes the potential safety hazard of having a broken wire at the setpoint control potentiometer place the controlled device (a motor or pump, for example) into a maximum-speed mode, regardless of system load requirements.

A still further object of the present invention is to provide a proportional-integral controller that has both stable and tight control and can run on a wide range of line frequencies, such as 50 Hz to 400 Hz, without changing any components or control settings.

Additional objects, advantages and other novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

To achieve the foregoing and other objects, and in accordance with the purposes of the present invention as described herein, an improved proportional-integral controller is provided having stable and "tight" control characteristics. The controller can be built using a small number of components and, therefore, at low cost.

In accordance with a further aspect of the invention, a variable ramp generator is used to achieve a very quick transient response to sudden changes in the load. The slope of the ramp signal increases as the system load demand is not satisfied (i.e., the process variable is below the setpoint). The slope of the ramp signal decreases as the system load demand is more than satisfied (the process variable is above the setpoint).

According to a further aspect of the invention, a constant threshold generator is used along with the variable ramp generator to achieve safe operation in the circumstance where a wire breaks at the set point control potentiometer, in which case the controlled device (e.g., a motor) is forced into a minimum speed mode, rather than a maximum-speed mode. This is achieved because the variable ramp generator outputs a zero value if a wire breaks at said setpoint control potentiometer.

In yet another aspect of the invention, an output device driver is used to achieve phase control of the controlled device, typically a motor or valve actuator. The variable ramp generator signal is compared to the constant threshold signal. When the variable ramp generator signal is of lesser magnitude than the constant threshold signal, the phase-control circuit output is OFF, and no current passes to the controlled device. When the variable ramp generator signal is of greater magnitude than the constant threshold signal, the phase-control circuit output is ON, and line current passes to the controlled device The constant threshold signal is changed, by use of a jumper or a switch, from 2 VDC for 110 VAC line voltage to 5 VDC for 220 VAC line voltage, and can be set to any desired value for other line voltages.

In a still further aspect of the invention, an output device driver circuit is used to drive the output device directly, typically a motor or valve actuator. If the output device requires Alternating Current, it is driven directly by line current switched by a high-current triac. If the output device requires Direct Current, it is driven by line current which is fed through a high-current bridge rectifier, and is switched by a high-current triac.

In accordance with yet another aspect of the invention, a Zero-crossing detector circuit is used to reset the variable ramp generator at each zero crossing (which occurs twice per full period of the line voltage sine wave). By resetting the variable ramp generator the proportional-integral controller can run on a wide range of line frequencies without changing any components or settings. The operating line frequency range of the P-I controller is at least 50 Hz to 400 Hz.

Still other objects of the present invention will become apparent to those skilled in this art from the following description wherein there is shown and described a preferred embodiment of this invention, simply by way of illustration, of one of the best modes contemplated for carrying out the invention. As will be realized, the invention is capable of other different embodiments, and its several details are capable of modification in various, obvious aspects all without departing from the invention. Accordingly, the drawings and descriptions will be regarded as illustrative in nature and not as restrictive.

BRIEF DESCRIPTION OF THE DRAWINGS

The accompanying drawings incorporated in and forming a part of the specification illustrate several aspects of the present invention, and together with the description serve to explain the principles of the invention. In the drawings.

Reference will now be made in detail to the present preferred embodiment of the invention, an example of which is illustrated in the accompanying drawings.

DETAILED DESCRIPTION OF THE PREFERRED EMBODIMENT

Figure 1:
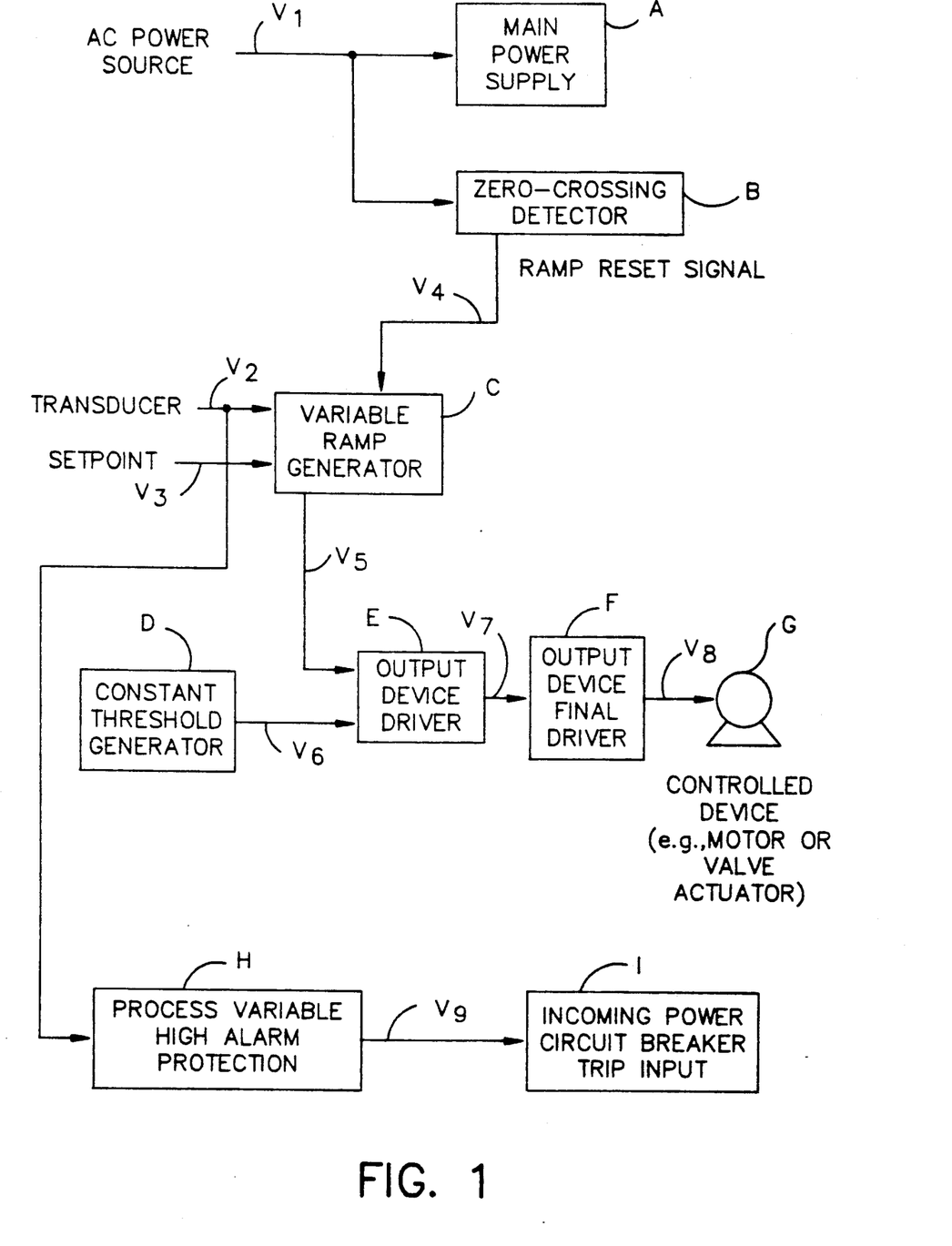
FIG. 1 is a block diagram of the entire proportional-integral controller showing three inputs (an AC Power source, a transducer, and a setpoint control device—typically a potentiometer), and one output (the controlled device—typically a motor or a valve actuator).

Referring now to the drawings, FIG. 1 shows a proportional-integral controller, in block diagram form, constructed in accordance with the present invention. The invention requires an AC power source, which can be a single-phase line providing either 110 VAC or 220 VAC, at a frequency in the range of 50 Hz to 400 Hz in the preferred embodiment. One side of the AC line voltage is connected to a circuit breaker (CB1 on FIG. 8), a voltage limiting device (a varistor, MOV1 on FIG. 8), and is finally connected to a power transformer (T1 on FIG. 8) through a jumper or a switch (S1 on FIG. 8). The jumper or switch is closed between positions "A" and "B" for operation on a 110 VAC line source, and between positions "B" and "C" for operation on a 220 VAC line source.

Figure 8:
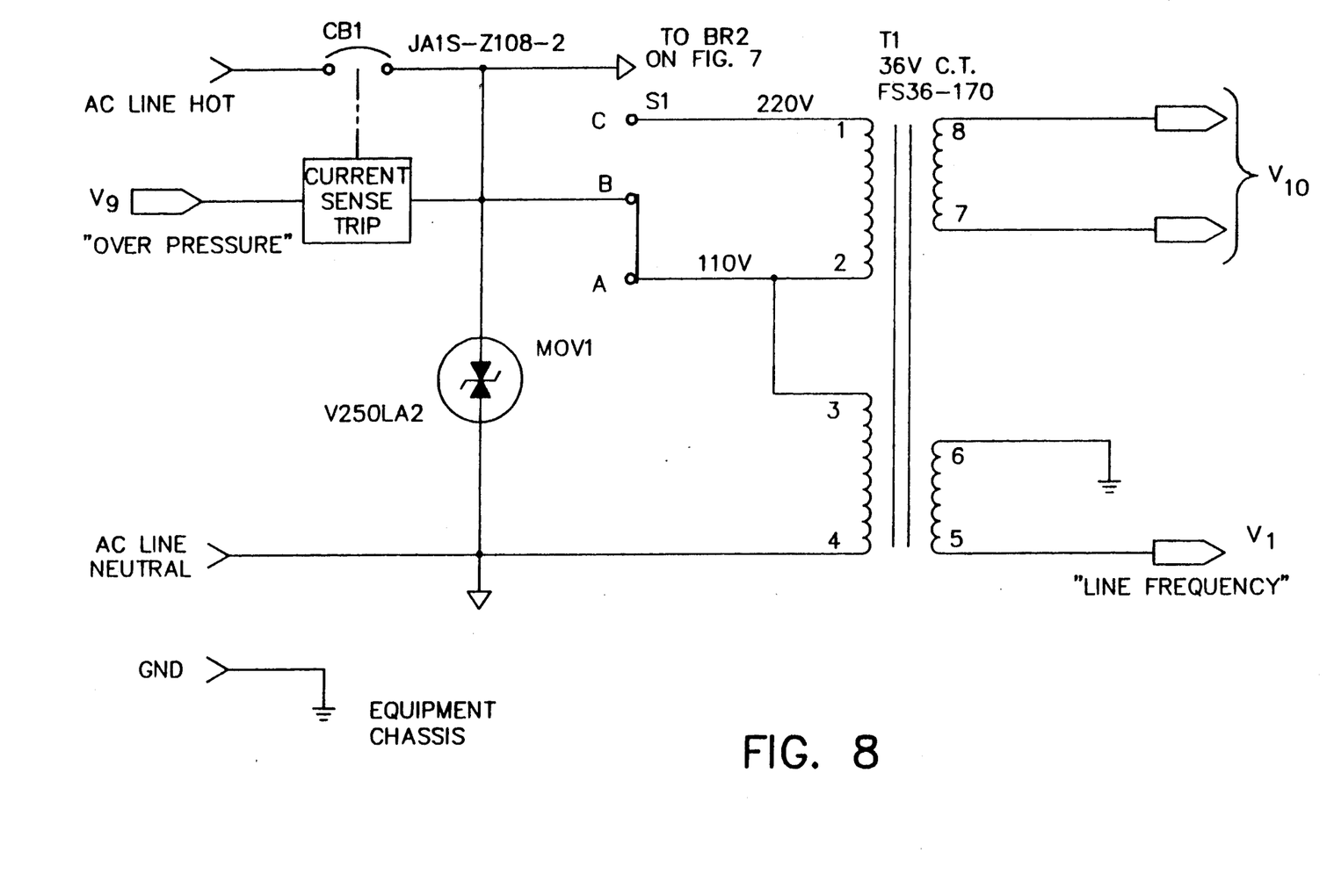
FIG. 8 is an electrical schematic which shows the front end of the power supply, and is directly connected to the incoming AC line voltage. It has an optional safety feature in case of a process variable high alarm (an over-pressure situation). When using the optional safety feature, the circuit requires the "Over Pressure" signal, $V_9$, as an input. In all cases, the circuit outputs AC power, $V_{10}$, to the D.C. power supply (FIG. 9), and the "Line Frequency" signal, $V_1$, to the "Zero-Crossing Detector" (FIG. 4).

The other side of the AC line voltage is connected to the remaining lead of the varistor (MOV1 on FIG. 8), then to the remaining side of the power transformer primary windings (T1 in FIG. 8).

The secondary side of the power transformer (T1 on FIG. 8) has two windings, one of which is connected to the "Main Power Supply" (item A on FIG. 1, and FIG. 9) and is designated $V_{10}$, the other of which is connected to the "Zero-Crossing Detector" circuit (item B on FIG. 1, and FIG. 4) and is designated "Line Frequency," $V_1$.

The ground conductor of the incoming AC power line is connected to the equipment chassis.

The "Over Pressure" signal is a safety feature of the preferred embodiment, and is designated $V_9$. The signal is derived from the "Over Pressure Protection" circuit (FIG. 10), and, when actuated, will cause CB1 to trip, thus de-energizing the entire controller.

Figure 9:
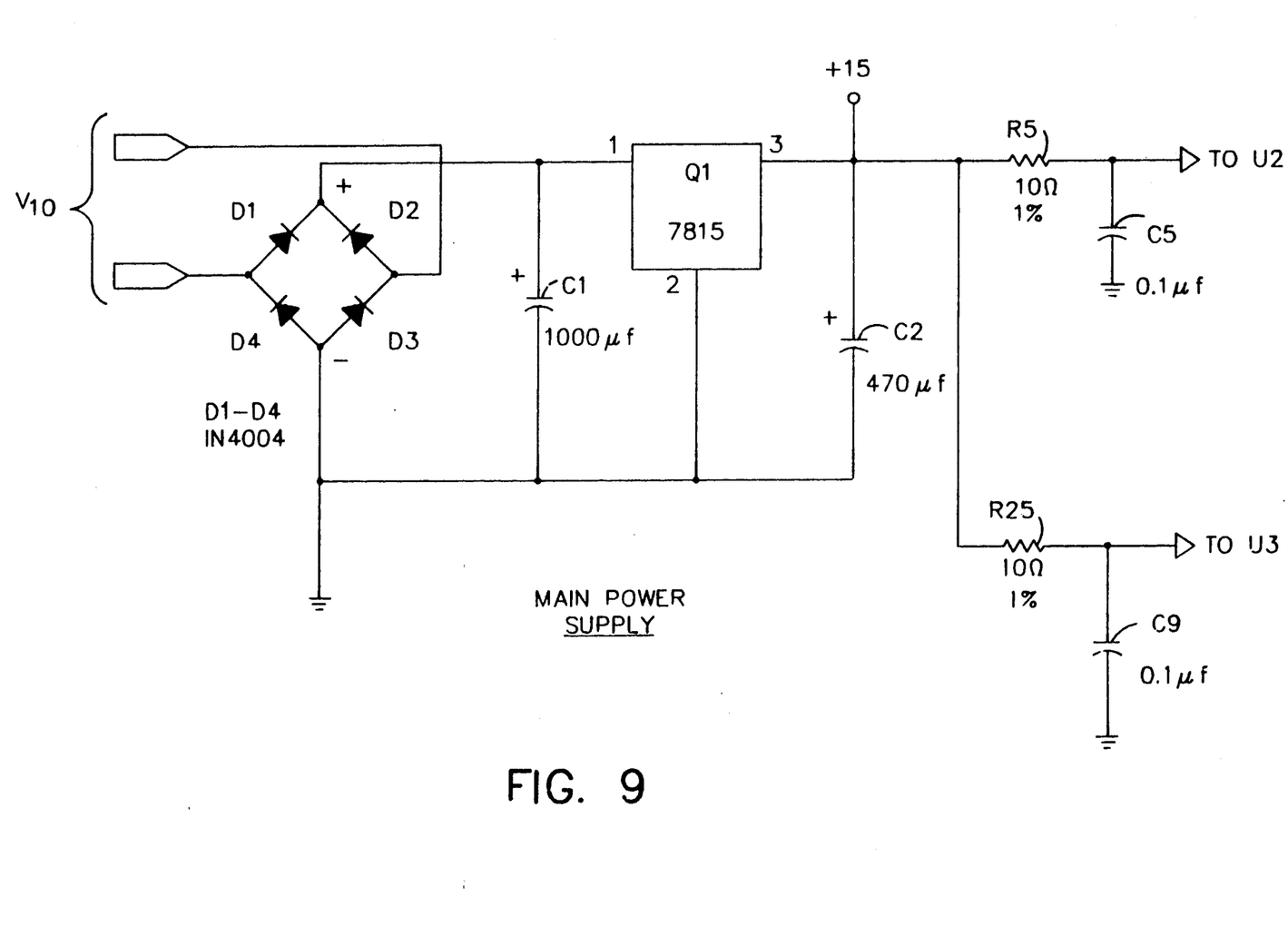
FIG. 9 is an electrical schematic which shows the "Main Power Supply" (item A on FIG. 1). It requires AC power, $V_{10}$, as an input, and outputs +15 VDC to various locations in the controller.

AC power signal voltage $V_{10}$ is connected into a diode bridge rectifier of the main power supply (items D1-D4, FIG. 9). The AC signal of $V_{10}$ is converted by the bridge rectifier into a DC signal and it is filtered by capacitor C1 on FIG. 9. This DC signal continues into a voltage regulator, designated as Q1 on FIG. 9, which is a three terminal DC voltage regulator with an output of 15 volts DC, on pin 3 of Q1. This DC voltage is again filtered by capacitor C2 on FIG. 9 and this +15 DC volt power supply is distributed to various points of the circuit. The 15 volt DC power supply is particularly sent to two integrated circuit chips, designated U2 and U3, and these voltages are filtered through an RC circuit, in the case of U2, resistor R5 and capacitor C5 on FIG. 9, and in the case of U3, resistor R25 and capacitor C9 on FIG. 9.

Figure 4:
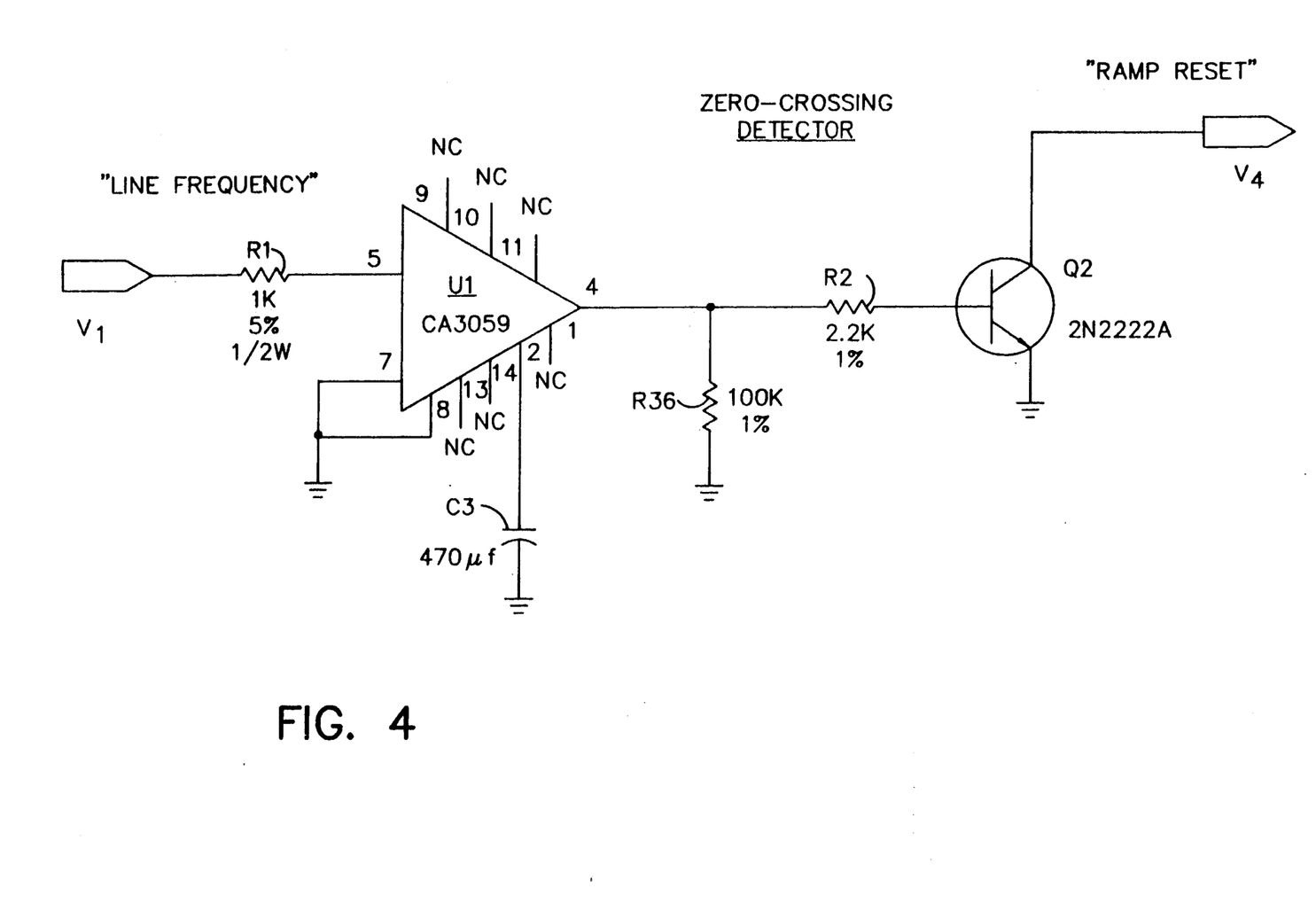
FIG. 4 is an electrical schematic which shows the "Zero-crossing Detector" circuit (Item B on FIG. 1). The circuit requires line frequency as an input, designated as $V_1$, and outputs a "Ramp Reset" signal, $V_4$.

The "line frequency" signal, $V_1$, is connected into the Zero-Crossing Detector, which is item B of FIG. 1, and FIG. 4. As shown in FIG. 4, the line frequency signal is connected to a resistor R1 and then continues into an integrated circuit chip designated U1. In this configuration U1 operates as a Zero-Crossing Detector and it outputs a signal every time the incoming line voltage crosses a zero on the sine wave in either direction. When U1 sends out its signal, it turns on transistor Q2 on FIG. 4. When Q2 is turned on, it conducts and its voltage, designated "Ramp Reset," $V_4$, is clamped to near-zero volts. At this moment, the Ramp Reset signal clamps the variable ramp signal, designated $V_5$, and thereby resets the variable ramp generator (item C on FIG. 1).

Figure 2:
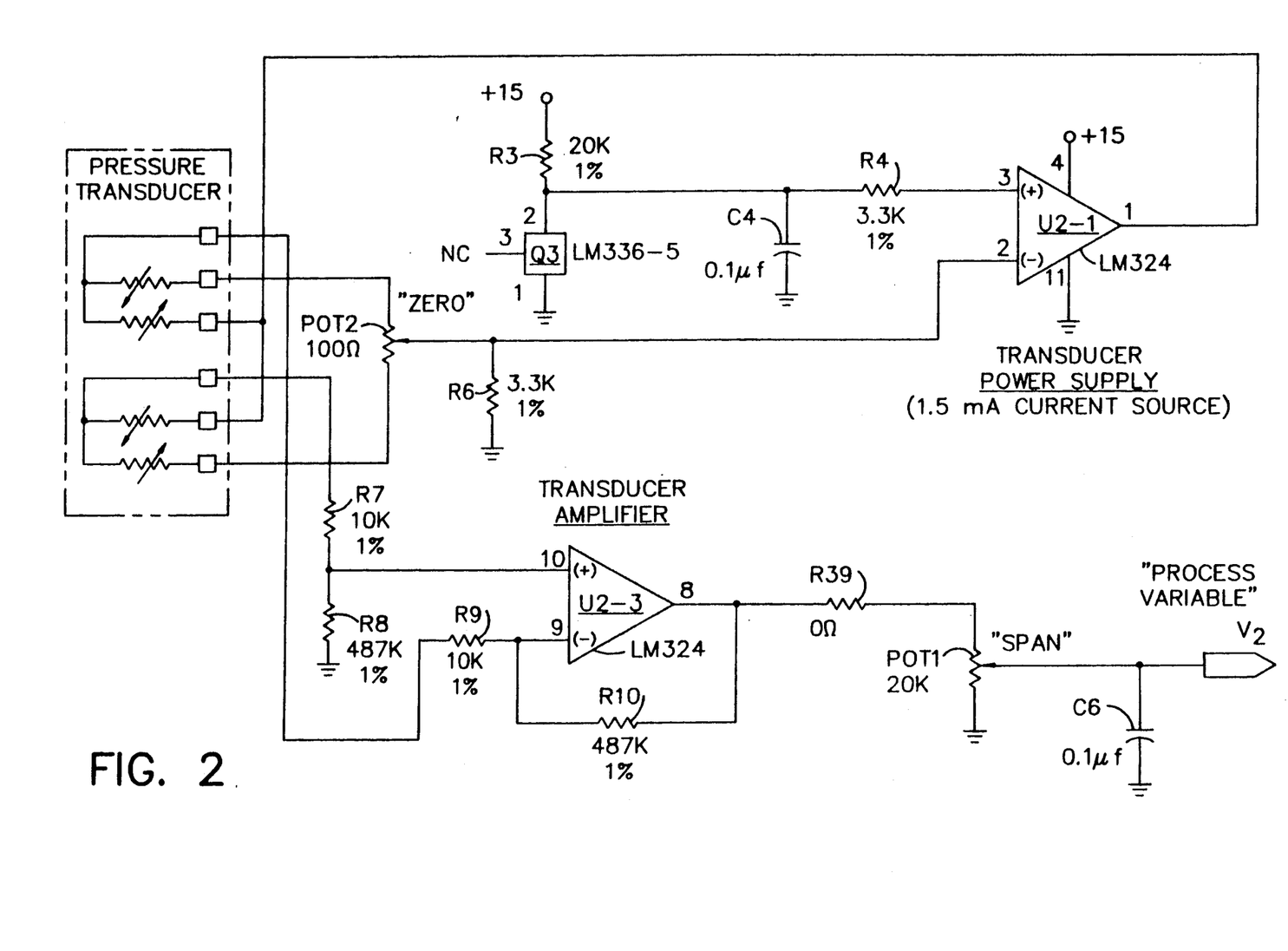
FIG. 2 is an electrical schematic which shows a pressure transducer and its corresponding "Transducer Power Supply" and "Transducer Amplifier." The output of the transducer amplifier is the correctly scaled present system pressure, referred to as the "Process Variable," $V_2$.

The next portion of the controller to be discussed will include the low level signals produced by the pressure transducer and the setpoint adjustment. Referring to FIG. 2, the pressure transducer is a variable resistance device, and has a power supply designated "Transducer Power Supply" in FIG. 2, which is a 1.5 milliamp current source produced by operational amplifier U2-1 on FIG. 2. The pressure transducer output signal is put into a voltage divider network, consisting of resistors R7 and R8 in FIG. 2, and then it is connected into another operational amplifier, designated U2-3. The "Zero" and "Span" adjustments are performed by adjusting two potentiometers, designated POT2, the "Zero" adjustment, and POT1, the "Span" adjustment. The signal that is sent from the span adjustment potentiometer, POT1 in FIG. 2, is designated the "Process Variable," $V_2$.

Figure 3:
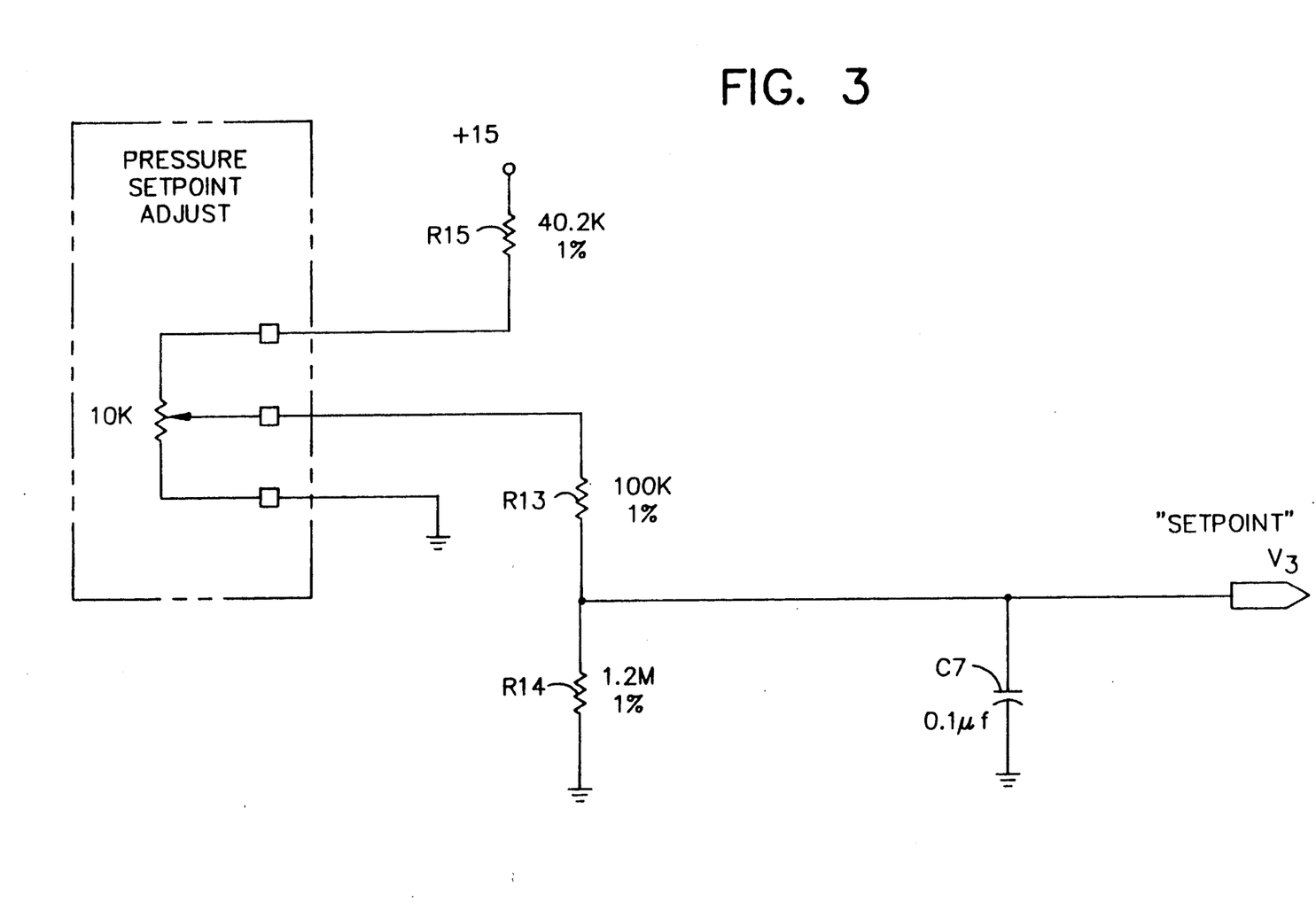
FIG. 3 is an electrical schematic which shows a "Pressure Setpoint" adjustment potentiometer, along with a voltage divider circuit. The output of the voltage divider circuit is the correctly scaled "Setpoint" voltage, $V_3$.

The other input device of this controller is the "Pressure Setpoint Adjust" potentiometer of FIG. 3. The setpoint adjustment potentiometer is powered by the +15 Volt DC power supply. Its output is put through a voltage divider network consisting of R13 and R14 in FIG. 3. The output of this voltage divider network is designated "Setpoint," $V_3$.

Figure 5:
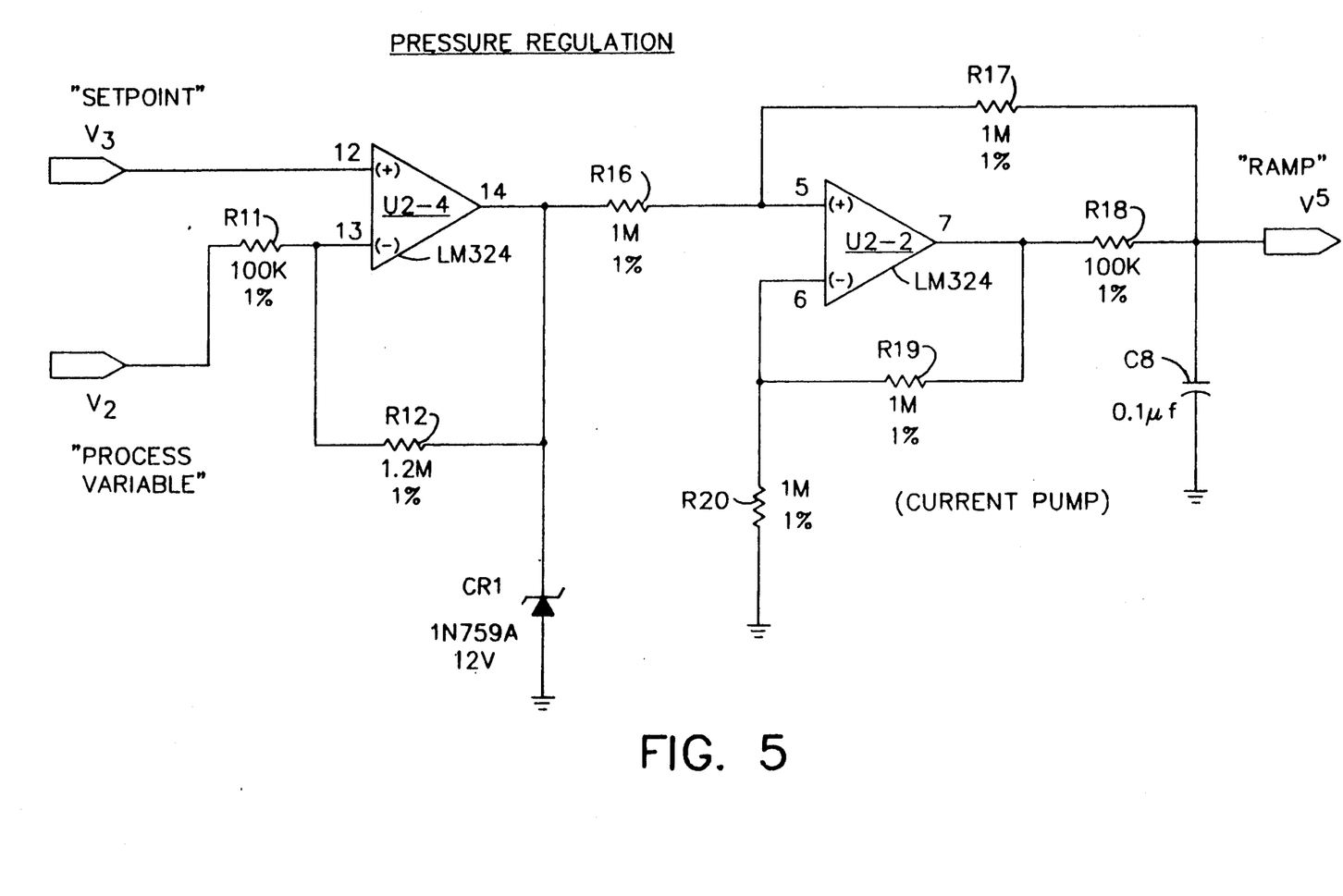
FIG. 5 is an electrical schematic which shows the process controller circuit, and can also be referred to as the "Variable Ramp Generator" (Item C on FIG. 1). It requires the setpoint voltage, $V_3$, and the process variable, $V_2$, as inputs, and it outputs the variable "Ramp" signal, $V_5$.

The two input signals are now combined at the pressure regulation stage, on FIG. 5. On FIG. 5 the "Setpoint" signal $V_3$, and the "Process Variable" signal, $V_2$ are subtracted from one another at the operational amplifier designated U2-4 on FIG. 5. The resulting difference signal is used to create the "Ramp" signal, $V_5$. This is done by the configuration around operational amplifier U2-2 on FIG. 5, which, in this configuration, becomes a current pump. This current pump is the heart of the "Variable Ramp Generator" (item C in FIG. 1), and the output of this portion of the circuit is a current source which charges capacitor C8 in FIG. 5. Depending on the difference signal that is outputted from operational amplifier stage U2-4, the slope of the ramp signal, $V_5$, in volts versus time depends upon the magnitude of the difference signal. The charging rate of capacitor C8 is a constant versus time, thereby resulting in a straight line voltage versus time whose slope is determined by the difference signal coming out of operational amplifier stage U2-4.

The "Ramp" signal can be driven quickly enough so that this circuit can operate at a much higher line frequency than 50 or 60 Hz. In fact, the controller according to the preferred embodiment can operate at a line frequency as high as 400 Hz with no changes to the components in this portion of the circuit. This portion of the circuit also has a built in safety feature; if one of the wires breaks on the "Pressure Setpoint Adjust" potentiometer (FIG. 3), then there will be zero or near zero voltage outputted by operational amplifier stage U2-4. Therefore, the ramp signal, $V_5$, will have a slope of "near-zero," and therefore, the voltage outputted from operational amplifier stage U2-2 will remain at near-zero.

Figure 6:
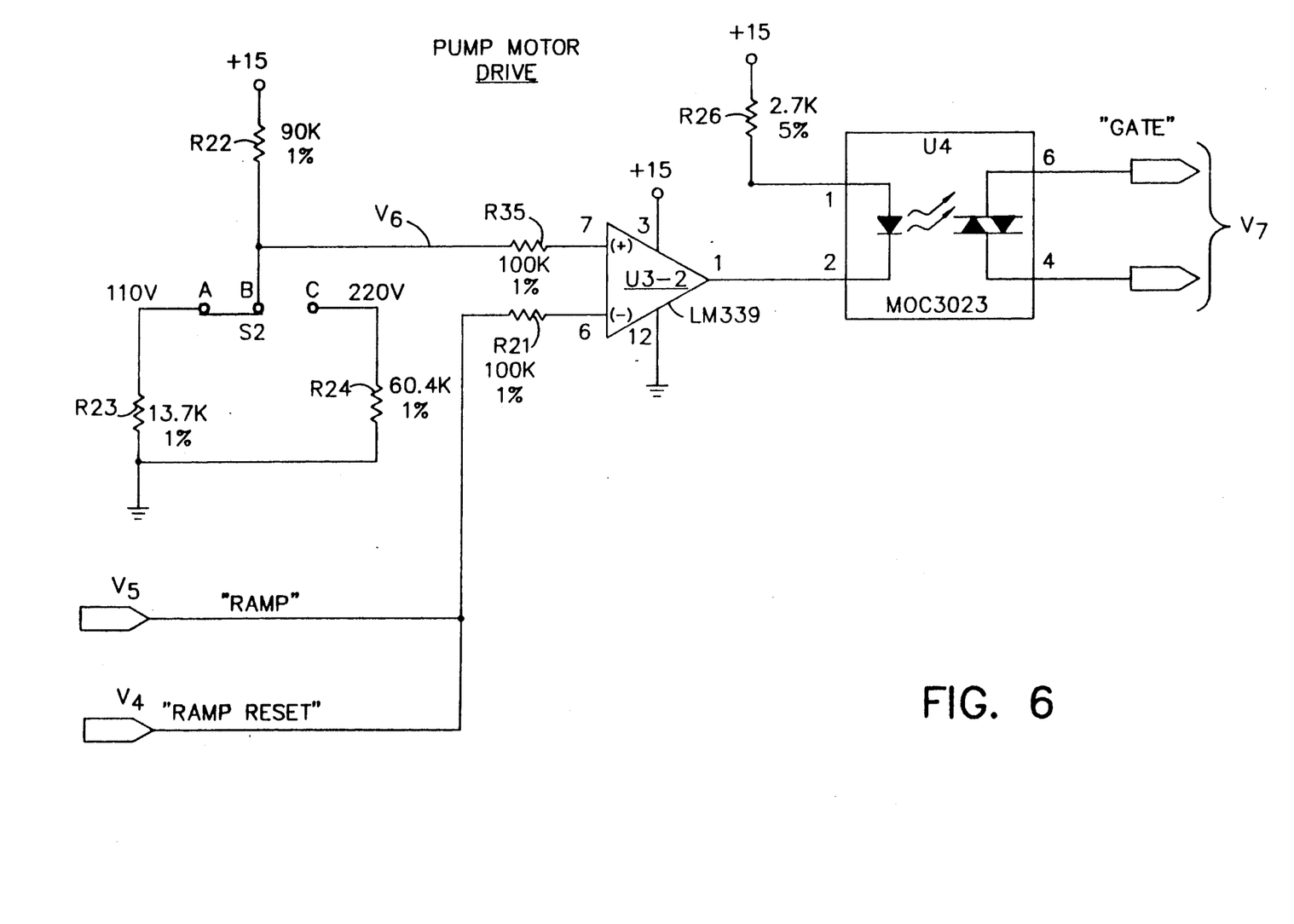
FIG. 6 is an electrical schematic which shows the "Pump Motor Drive" circuit, and can also be referred to as the "Output Device Driver" (item E on FIG. 1). It requires the ramp voltage, $V_5$, and ramp reset signal, $V_4$, as inputs, and it outputs a pulse width, $V_7$, which is used to gate the load-current-carrying triac (item Q4 on FIG. 7). It generates the "Constant Threshold" signal, designated $V_6$ (item D on FIG. 1).

The purpose of keeping the ramp signal, $V_5$, near zero in the case of a broken wire on the setpoint potentiometer is that the desirable result of such a circumstance would be to have the controlled device (typically a motor) go to its minimum state or speed rather than its maximum state or speed, occurs in the prior art. This desired safety feature is achieved at operational amplifier U3-2 on FIG. 6. The constant threshold voltage, designated $V_6$, is created at the "Pump Motor Drive" circuit shown in FIG. 6. $V_6$ is created from a +15 volt DC signal directed through a voltage divider circuit. This voltage divider circuit consists of resistors R22, and either resistor R23 or R24. Resistors R23 or R24 are brought into the circuit by use of a jumper or switch, designated S2 on FIG. 6. In the case of a 110 VAC line voltage, S2 is placed in the position to connect terminal A to terminal B. In the case of a 220 VAC line voltage, S2 is positioned so that the contact is placed between pins B and C. The resulting voltage, $V_6$, is a constant voltage which is connected through a resistor into the plus input of operational amplifier U3-2. The difference between voltage $V_6$ and the ramp voltage $V_5$ is compared by operational amplifier stage U3-2. When the ramp voltage, $V_5$, is greater than the constant threshold voltage, $V_6$, then the output of U3-2 is switched to a "low" voltage state, thereby allowing current to conduct through the LED input of opto-isolator U4 on FIG. 6. In this condition, opto-isolator U4's triac output then conducts current and becomes a "gate" signal, designated $V_7$ in FIG. 6 and in FIG. 1. At this time it should be noted that FIG. 6 consists of the blocks in FIG. 1 designated as D, the "Constant Threshold Generator," and E, designated "Output Device Driver."

In the condition where the "Ramp" voltage, $V_5$, is less than the constant threshold voltage, $V_6$, the output of operational amplifier U3-2 is switched to a "high" voltage state, and this does not allow current to flow through the LED input of opto-isolator U4. In this condition, the triac output of opto-isolator U4 does not conduct current and, therefore, no current flows out the "Gate" signal, $V_7$, in FIG. 6. This is where the previously mentioned safety feature comes into play; if the "Ramp" signal, $V_5$, remains at zero or near-zero volts at all times, then the output of operational amplifier U3-2 will always remain in a "high" condition. Under this condition there will be no current flowing out of the triac output of opto-isolator U4, and therefore, as will be seen, there will be no current flowing into the controlled device, which is usually a motor or a valve actuator, thereby making the entire control system safe because the motor or valve actuator will go to its minimum speed or position (and not its maximum speed or position).

Figure 7:
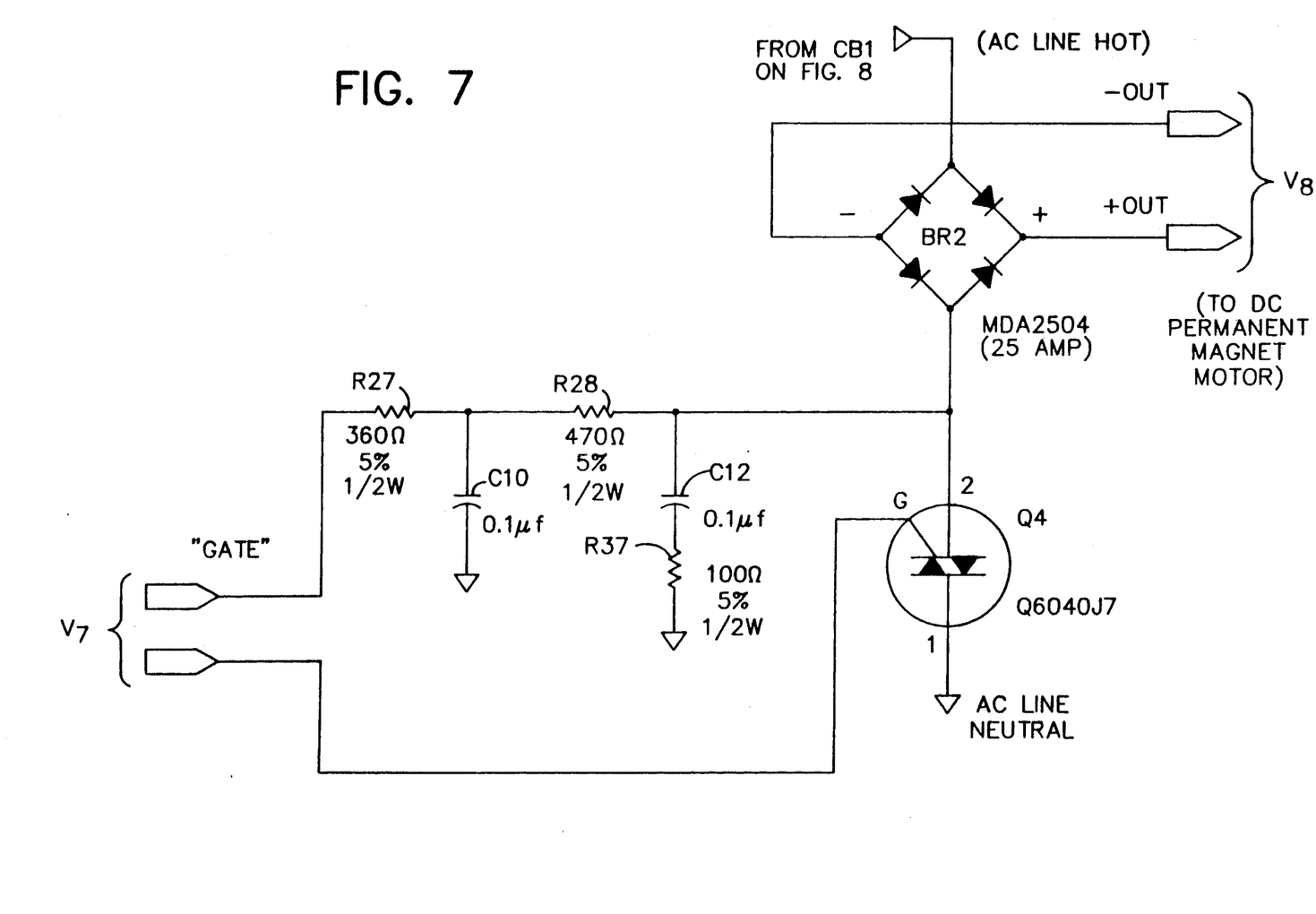
FIG. 7 is an electrical schematic which shows the final drive stage of the "Output Device Final Driver" circuit (item F on FIG. 1). It requires the "Gate" pulse-width signal, $V_7$, as an input, and outputs a high-current pulse-width signal, $V_8$, directly to the controlled device, in this case, a DC permanent magnet motor (item G on FIG. 1).

The "Gate" signal, designated $V_7$, is sent into the output device final driver (item F on FIG. 1). The signal $V_7$ is conditioned by several resistors and capacitors, as shown on FIG. 7, and this signal is used to operate the gate input of triac Q4 (FIG. 7). When current flows into the gate input of Q4, triac Q4 is turned on and will conduct alternating current through it, thereby allowing current to flow through the bridge rectifier, designated BR2 on FIG. 7. In the preferred embodiment, the final output of the controller of this invention is connected to a DC permanent magnet motor, and this power voltage is designated $V_8$ in FIG. 1, and FIG. 7. This DC permanent magnet motor is the previously mentioned controlled device, and it could just as easily be a valve actuator, requiring alternating current, rather than direct current. If the controlled device requires alternating current, then it would be hooked up in series with the bridge rectifier designated BR2 in FIG. 7. In order to connect such an AC device in series with bridge rectifier BR2, one side of the controlled device will be connected to the top of BR2 as shown in FIG. 7 and the other side of the AC controlled device will be connected directly to the AC line voltage.

Figure 10:
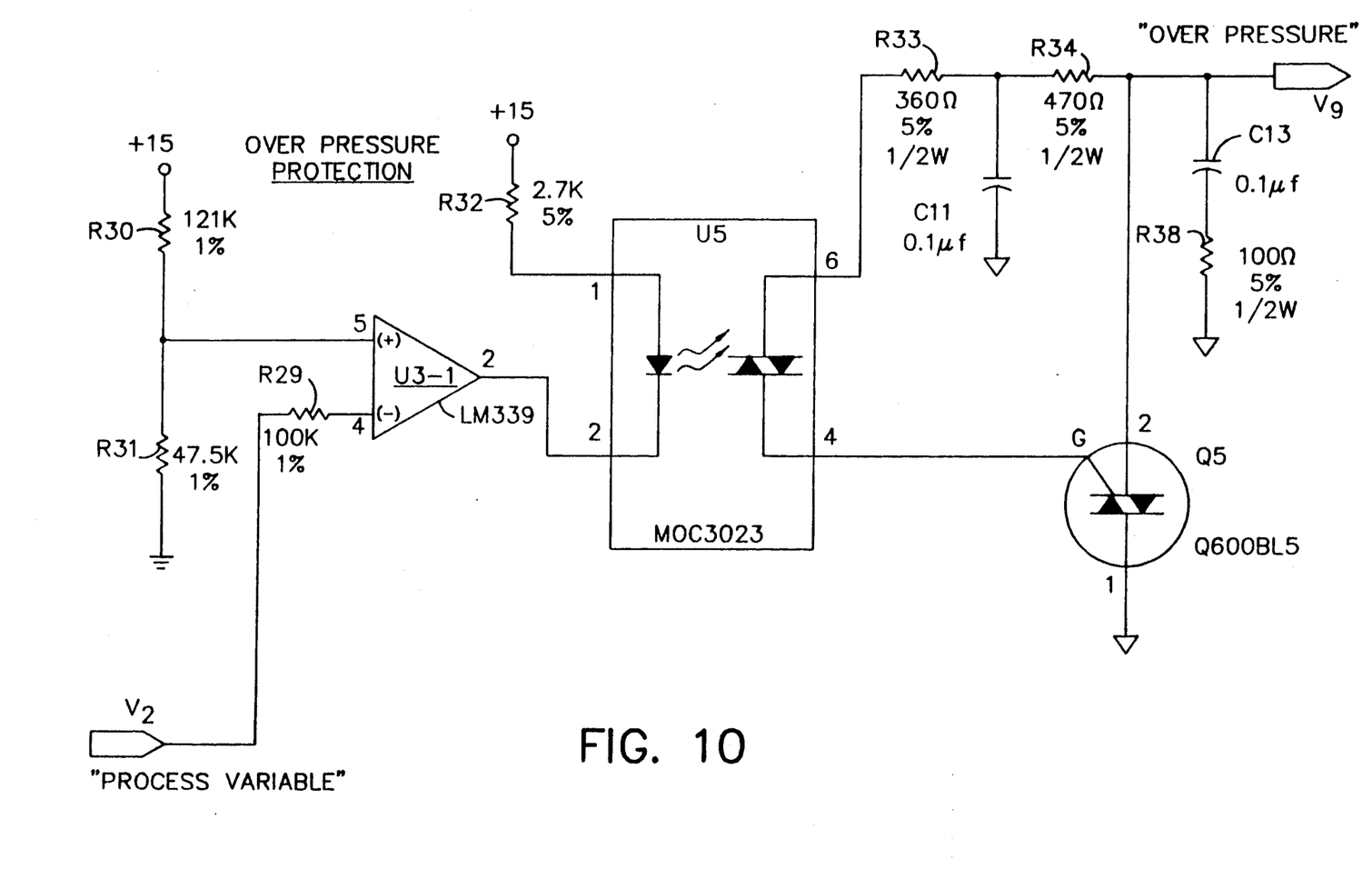
FIG. 10 is an electrical schematic which shows the "Over Pressure Protection" circuit (item H on FIG. 1). It requires the "Process Variable," $V_2$, as an input, and outputs an "Over Pressure" safety shut-off signal, $V_9$, to the power supply (at CB1 on FIG. 8).

The previously mentioned "Over Pressure" signal is created by the circuit shown in FIG. 10. A constant voltage is created by the voltage divider network consisting of resistors R30 and R31 in FIG. 10. This constant voltage is compared to the "Process Variable," $V_2$, by operational amplifier U3-1 on FIG. 10. Under normal conditions the process variable is lower in magnitude than the constant voltage created by the voltage divider network of R30 and R31. Under these normal conditions the output of operational amplifier U3-1 is in a "high" state, thereby not allowing current to conduct through the LED input of opto-isolator U5 in FIG. 10. In this normal state, the triac output of opto-isolator U5 also will not conduct current and therefore will not send current into the gate input of triac Q5 in FIG. 10. Again, in this normal condition there is no current flowing out of the circuit shown in FIG. 10, designated "Over Pressure," $V_9$. Therefore, the over pressure signal, $V_9$, will not trip circuit breaker CB1 of FIG. 8. If, on the other hand, the process variable, $V_2$, exceeds in magnitude the constant voltage created by the voltage divider consisting of R30 and R31, then the output of operational amplifier U3-1 will then go into a "low" state, and current will conduct through the LED input of opto-isolator U5. In this condition, current will also flow through the triac output of opto-isolator U-5, thereby gating triac Q5, and further sending current through the output of this "Over Pressure" signal, designated $V_9$. When this occurs, the current going through the "Current Sense Trip" of circuit breaker CB1 on FIG. 8 will cause circuit breaker CB1 to trip and disconnect the incoming AC power from the rest of the controller system. This is an added safety feature of the preferred embodiment of the invention.

In summary, numerous benefits have been described which result from employing the concepts of the invention. Because of the low component count of the preferred embodiment, the associated cost of producing this invention is also low. There are two built-in safety features of this invention, the first being an over-pressure safety signal which will disconnect power from the controller in the event of an over-pressure condition, and secondly if a wire breaks on the setpoint potentiometer, the controlled device will be driven into its minimum state rather than its maximum state. The use of the combination of the constant threshold generator and the variable ramp generator creates both a safe condition in the event of a broken wire at the setpoint potentiometer, and also makes it possible for the invention to have very quick transient response to sudden changes in the load condition. The further combination of the variable ramp generator, constant threshold generator, and the zero-crossing detector make it possible for this invention to work on a wide variety of incoming line frequencies, without changing the components of the controller.

The foregoing description of a preferred embodiment of the invention has been presented for purposes of illustration and description. It is not intended to be exhaustive or to limit the invention to the precise form disclosed. Obvious modifications or variations are possible in light of the above teachings. The embodiment was chosen and described in order to best illustrate the principles of the invention and its practical application to thereby enable one of ordinary skill in the art to best utilize the invention in various embodiments and with various modifications as are suited to the particular use contemplated. It is intended that the scope of the invention be defined by the claims appended hereto.

What is claimed is:

1. A process controller, comprising:
    (a) a proportional-integral controller, said controller including:
        (i) means for detecting a deviation between an actual value of a process variable, and a desired value at which said process variable is to be maintained;
        (ii) a variable ramp generator which generates a signal having a variable slope, in volts divided by time, which is varied as needed to maintain said desired value of said process variable, based upon said deviation between the actual and desired values of said process variable;
        (iii) a constant threshold generator which generates a constant voltage value for a given incoming power source line voltage;
        (iv) means for comparing said variable ramp signal to said constant threshold voltage, and for outputting a resulting signal;
    (b) means for controlling voltage delivered to a controlled device in response to said resulting signal, in such manner as to cause an increase or decrease in the value of said actual process variable as required to maintain said actual process variable at said desired value.

2. A process controller as recited in claim 1, further comprising means for resetting said variable ramp generator in response to the occurrence of zero crossings of said incoming power source.

3. A process controller as recited in claim 1, further comprising means for driving said controlled device to its minimum speed or position in response to a failure of said desired value of said process variable.

4. A process controller as recited in claim 1, further comprising means for disconnecting said incoming power source from said process controller in the event whenever said process variable exceeds a pre-determined upper limit.

5. A process controller as recited in claim 2, further comprising means for driving said controlled device to its minimum speed or position in response to a failure of said desired value of said process variable 6. A process controller as recited in claim 2, further comprising means for disconnecting said incoming power source from said process controller in the event whenever said process variable exceeds a pre-determined limit.

7. A process controller as recited in claim 6, further comprising means for driving said controlled device to its minimum speed or position in response to a failure of said desired value of said process variable.

8. A process controller as recited in claim 1, further comprising means for electrically driving the controlled device.

9. A process controller as recited in claim 2, further comprising means for electrically driving the controlled device.

10. A process controller as recited in claim 3, further comprising means for electrically driving the controlled device.

11. A process controller as recited in claim 4, further comprising means for electrically driving the controlled device.

12. A process controller as recited in claim 5, further comprising means for electrically driving the controlled device.

13. A process controller as recited in claim 6, further comprising means for electrically driving the controlled device.

14. A process controller as recited in claim 7, further comprising means for electrically driving the controlled device.

* * * * *